United States Patent [19]

Furuyama

[11] 4,368,529

[45] Jan. 11, 1983

[54] SEMICONDUCTOR MEMORY CIRCUIT

[75] Inventor: Tohru Furuyama, Yokohama, Japan

[73] Assignee: Tokyo Shibaura Denki Kabushiki Kaisha, Japan

[21] Appl. No.: 197,950

[22] Filed: Oct. 17, 1980

[30] Foreign Application Priority Data

Oct. 23, 1979 [JP] Japan .............................. 54-136632

[51] Int. Cl.$^3$ ............................................. G11C 11/40
[52] U.S. Cl. .................................. 365/205; 365/203; 365/208
[58] Field of Search ............... 365/205, 210, 208, 190, 365/203

[56] References Cited

PUBLICATIONS

IEEE Journal of Solid State Circuits–vol. SC-11, No. 5, pp. 596-601., Oct. 1976.
Ieda et al., *A 64K MOS RAM Design*, Japanese Journal of Applied Physics, vol. 17, Supplement 17-1, pp. 57-63 (1978).

*Primary Examiner*—James W. Moffitt
*Attorney, Agent, or Firm*—Finnegan, Henderson, Farabow, Garrett & Dunner

[57] ABSTRACT

A semiconductor matrix circuit includes first and second matrix arrays of semiconductor memory cells, a plurality of sense amplifiers each having a flip-flop circuit, a plurality of first bit lines each commonly connected to memory cells in the same row of the first matrix array and also connected respectively to first bi-stable output terminals of the flip-flop circuits, and a plurality of second bit lines each commonly connected to memory cells in the same row of the second matrix array and also connected respectively to second bi-stable output terminals of the flip-flop circuits. Switching MOS transistors are each connected between the first and second bi-stable output terminals of a corresponding one of the flip-flop circuits. After a reading operation, the first and second bit lines are selectively set to high and low potential levels $V_D$ and $V_S$, and subsequently all the switching MOS transistors are rendered conductive to set the potential on all the bit lines to an intermediate level $(V_D+V_S)/2$.

16 Claims, 13 Drawing Figures

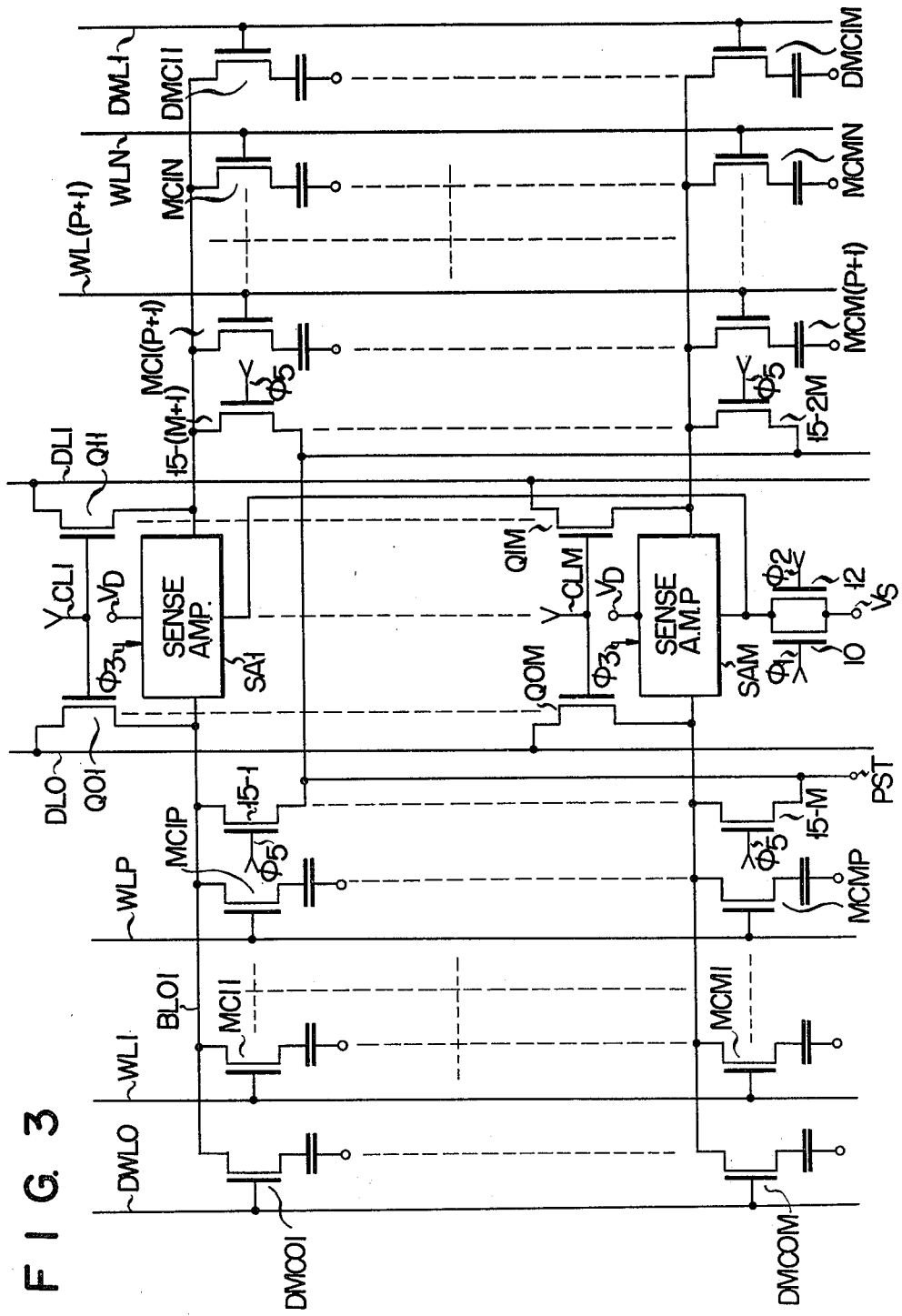
F I G. 3

SEMICONDUCTOR MEMORY CIRCUIT

BACKGROUND OF THE INVENTION

This invention relates to semiconductor memory circuits.

Recently, various improvements have been made on MOS semiconductor memory devices for the purposes of realizing high integration density and high operation speed and also realizing systems using a single power supply. For a system using a single power supply, it is usual practice to form an on-chip substrate bias circuit on a substrate on which a memory circuit is also formed. Such an on-chip substrate bias circuit includes an oscillator driven by the output voltage from a single power supply and a rectifier for rectifying an oscillation output signal from the oscillator and for supplying a bias voltage of a predetermined level, for instance $-2$ V, to the substrate, However, the conduction capacity of the rectifier is generally not so large, and sometimes it cannot permit charges flowing from the memory into the substrate at the time of operation of the memory to be entirely drained to ground. In such a case, floating charges remaining in the substrate cause fluctuations of the substrate potential. In a memory device using the on-chip substrate bias circuit, component elements such as decoders and bit lines are capacitively coupled to the substrate, so that there arises the problem of substrate potential fluctuations with potential variations in the decoders and bit lines. Particularly, in dynamic random access memories, the substrate potential fluctuations caused with potential variations in bit lines due to the capacitive coupling between the bit lines and the substrate have noticeable influence upon the memory operation.

SUMMARY OF THE INVENTION

It is an object of the invention to provide a semiconductor memory circuit which is free from fluctuations of the substrate potential with potential changes in the bit lines.

In one form of the invention, there is provided a semiconductor memory circuit, which comprises at least one flip-flop circuit including two MOS transistors whose the drains are connected to respective bi-stable output terminals and also connected through respective switching means to a first voltage supply terminal and whose sources are connected to each other, paired bit lines connected to the bi-stable output terminals of the flip-flop circuit, a plurality of semiconductor memory cells connected to each bit line, a switching MOS transistor circuit connected between the aforementioned sources of the MOS transistors and a second voltage supply terminal, and means for setting the potential on the bit lines to a voltage level between the levels of voltages to be applied to the first and second voltage supply terminals.

BRIEF DESCRIPTION OF THE DRAWINGS

FIG. 3 is a circuit diagram showing a modification of the semiconductor memory circuit shown in FIG. 1.

DETAILED DESCRIPTION OF THE PREFERRED EMBODIMENTS

Figure 1:
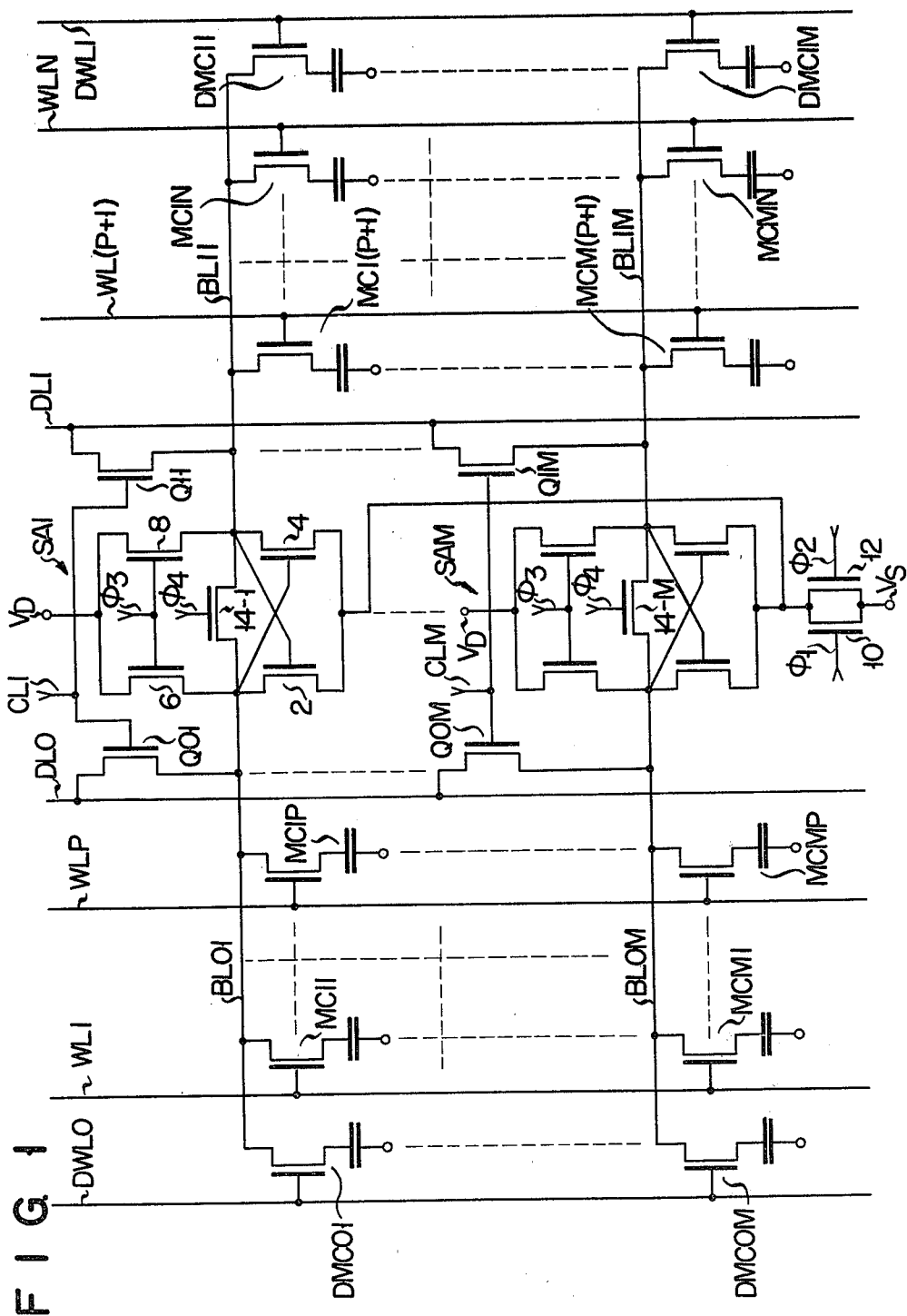
FIG. 1 is a circuit diagram showing an embodiment of the semiconductor memory circuit according to the invention.

FIG. 1 shows a circuit diagram of a semiconductor memory circuit having a plurality of memory cells each including a MOS transistor and a capacitor. The semiconductor memory circuit also includes sense amplifiers SA1 to SAM. Each of the sense amplifiers SA1 to SAM is formed of a flip-flop circuit having MOS transistors 2 and 4 which have their drains connected through respective MOS transistors 6 and 8 to a voltage supply terminal $V_D$ and have their sources connected to each other. The MOS transistors 2 and 4 have their gates each connected to the drain of the other, these drains constituting bi-stable output terminals of the flip-flop circuit, and their sources are connected through the current paths of MOS transistors 10 and 12 to a voltage supply terminal $V_S$. The sense amplifiers SA1 to SAM also include respective MOS transistors 14-1 to 14-M each connected between the bi-stable output terminals of each sense amplifier.

The semiconductor memory circuit also includes paired bit lines BL01 and BL11, . . . , and BL0M and BL1M. The bit lines of each pair are connected to the respective bi-stable output terminals of the flip-flop circuit of each of the sense amplifiers SA1 to SAM. Of the memory cells, those MC11 to MC1P, . . . , and MCM1 to MCMP are connected to the respective bit lines BL01 to BL0M, and those MC1 (P+1) to MC1N, . . . , and MCM (p+1) to MCMN are connected to the respective bit lines BL11 to BL1M. The memory circuit further includes dummy memory cells DMC01 to DMC0M connected to the respective bit lines BL01 to BL0M and those DMC11 to DMC1M to the respective bit lines BL11 to BL1M. A data line DL0 is connected to the bit lines BL01 to BL0M through respective MOS transistors Q01 to Q0M, and also a data line DL1 is connected to the bit ines BL11 to BL1M through respective MOS transistors Q11 to Q1M.

Clock signals $\phi 1$ and $\phi 2$ are produced from a clock signal generator (not shown) to the gates of the MOS transistors 10 and 12, respectively. A clock signal $\phi 3$ is supplied to the gates of the MOS transistors 6 and 8 of the sense amplifiers SA1 to SAM, a clock signal $\phi 4$ is supplied to the gates of the MOS transistors 14-1 to 14-M of the sense amplifiers SA1 to SAM, and a clock signal CL1 is supplied to the gates of the MOS transistors Q01 to Q0M and Q11 to Q1M.

Word lines WL1, . . . , WLN are respectively connected to the memory cells MC11 to MCM1, . . . , MC1N to MCMN. A dummy word line DWL0 is commonly connected to the dummy memory cells DMC01 to DMC0M, and a dummy word line DWL1 is commonly connected to the dummy memory cells DMC11 to DMC1M.

In the semiconductor memory circuit of FIG. 1, the potential level of the bit lines BL01 to BL0M and BL11 to BL1M is determined by the conduction states of the MOS transistors 2 and 4 in the sense amplifiers SA1 to SAM when the MOS transistors 6, 8, 10 and 12 are each set in a conductive state. For example, with the MOS trasistors 2 and 4 of the sense amplifier SA1 respectively conductive and nonconductive, the potentials of the bit lines BL01 and BL11 are respectively set at high and low levels. When the MOS transistors 6, 8, 10 and 12 are subsequently rendered nonconductive, the potentials on the bit lines BL01 and BL11 are respectively held at the low and high levels $V_S$ and $V_D$. Afterwards, the MOS transistors 14-1 to 14-M which are coupled to the respective sense amplifiers SA1 to SAM are rendered conductive, whereby the potentials on all the bit lines BL01 to BL0M and BL11 to BL1M are set to an intermediate level $(V_D+V_S)/2$. In this state, a high level voltage is applied to the dummy word lines DWL0 and DWL1, whereby data corresponding to the potential level $(V_D+V_S)/2$ is stored in all the dummy memory cells DMC01 to DMC0M and DMC11 to DMC1M. In the above way, in the normal state of the memory, the potentials on all the bit lines BL01 to BL0M and BL11 to BL1M are set to the intermediate potential level $(V_D+V_S)/2$, and data corresponding to this intermediate potential level is stored in all the dummy memory cells DMC01 to DMC0M and DMC11 to DMC1M.

Now, the reading operation of the semiconductor memory circuit of FIG. 1 will be described with reference to FIGS. 2A to 2K.

Assume now that a data "1" having been stored in the memory cell MC11 is read out therefrom. For the reading operation, the data lines DL0 and DL1 are precharged to the high potential level $V_D$.

Figure 2A:
FIGS. 2A to 2K respectively show waveforms of signals appearing at various points in the semiconductor memory circuit of FIG. 1 for illustrating the reading operation thereof.

First, the MOS transistors 14-1 to 14-M, coupled to the respective sense amplifiers SA1 to SAM, are all set to their nonconductive state when the potential of the clock signal $\phi 4$ is changed to a low level as shown in FIG. 2A.

Figure 2B:
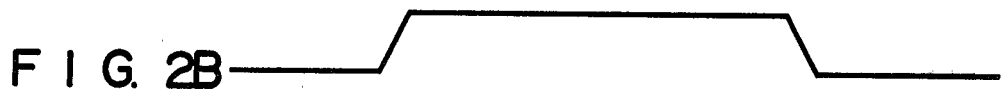
Figure 2C:
Figure 2D:
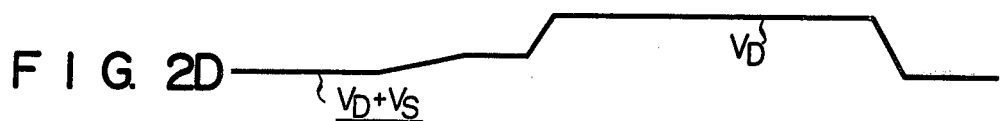
Figure 2E:

Subsequently, the MOS transistors constituting the memory cells MC11 to MCM1 and those constituting the dummy cells DMC11 and DMC1M are rendered conductive by application of a high level voltage $(V_D+\Delta V_D)$ ($\Delta V_D$ being higher than the threshold voltage of the MOS transistor of the memory cell) to the word line WL1 and dummy word line DWL1, as shown in FIGS. 2B and 2C. As a result, the potential on the bit line BL01 is gradually increased as shown in FIG. 2D, while the potential on the bit line BL11 remains unchanged as shown in FIG. 2E.

Figure 2F:

In a resultant state, with a slight potential difference produced between the bit lines BL01 and BL11, the MOS transistor 10 is rendered conductive when the voltage level of the clock signal $\phi 1$ is changed to a high level as shown in FIG. 2F. As a result, the source potential on the MOS transistors 2 and 4 is gradually reduced to render the MOS transistors 2 and 4 nonconductive and conductive, respectively, thereby to keep the potential on the bit line BL01 constant as shown in FIG. 2D, while gradually lowering the potential on the bit line BL11 as shown in FIG. 2E. This increases the potential difference between the bit lines BL01 and BL11.

Figure 2G:
Figure 2H:

At a subsequent moment, the clock signals $\phi 2$ and $\phi 3$ are set to have a high voltage level as shown in FIGS. 2G and 2H to render the MOS transistors 6, 8 and 12 conductive. Since the MOS transistors 12 have comparatively high mutual conductance, the source potential on the MOS transistors 2 and 4 is instantly reduced down to the low level $V_S$ so that the MOS transistors 2 and 4 can be stably rendered nonconductive and conductive, respectively. Since, at this time, the MOS transistors 6 and 8 are kept conductive, the potential on the bit line BL01 is instantly increased up to the high potential level $V_D$, while the potential on the bit line BL11 is reduced to a level determined by the ratio of mutual conductance between the MOS transistors 4 and 8.

Figure 2I:

Subsequently, the voltage level of the clock signal $\phi 3$ is changed to a low level as shown in FIG. 2H to render the MOS transistors 6 and 8 nonconductive. As a result, the potential on the bit line BL11 is lowered down to the low potential level $V_S$ as shown in FIG. 2E. In this state, a selection clock signal for selecting the sense amplifier SA1, as shown in FIG. 2I, is impressed upon the gates of MOS transistors Q01 and Q11, thus coupling the bi-stable output terminal of this sense amplifier SA1 through the MOS transistors Q01 and Q11 to the data lines DL0 and DL1. Thus, high and low level signals are sent forth through the respective MOS transistors Q01 and Q11, that is, the data signal "1" is read out.

Afterwards, the word line WL1 and clock signal CL1 are each changed to have a low voltage level as shown in FIGS. 2B and 2I, and later the clock signals $\phi 1$ and $\phi 2$ are each changed to have a low voltage level as shown in FIGS. 2F and 2G.

In this state, the clock signal $\phi 4$ is changed to have a high voltage level as shown in FIG. 2A to render the MOS transistor 14 conductive so that the potentials on the bit lines BL01 and BL11 are set to the intermediate level $(V_D+V_S)/2$ again. At this time, a voltage of the intermediate level $(V_D+V_S)/2$ is also supplied to the dummy memory cell DMC11, and data corresponding to the intermediate voltage $(V_D+V_S)/2$ can be stored in the dummy memory cell DMC11 when a voltage supplied to the dummy word line DWL1 is changed to have a low level as shown in FIG. 2C. It is to be noted here that the potential level of the bit lines BL01 to BL0M immediately after the change of the word line WL1 to the low level is determined by the data stored in the memory cells MC11 to MCM1 and that after the potential on the word line WL1 is lowered the same data as before are stored.

Figure 2J:
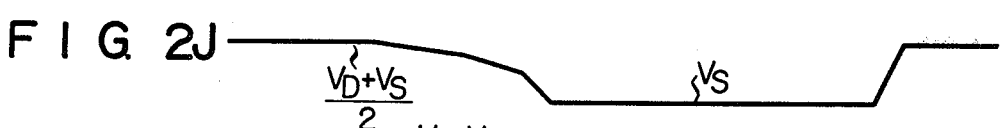
Figure 2K:
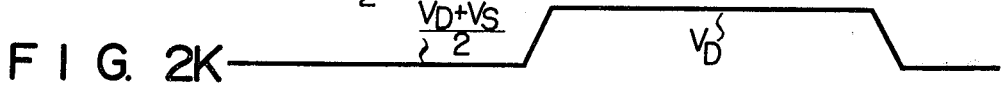

Substantially the same operation as described above also takes place in case when data "0" stored in the memory cell MC11 is read out therefrom. Like the previous case, the word line WL1 and dummy word line DWL1 are energized to render conductive the MOS transistors constituting the memory cells MC11 to MCM1 and dummy memory cells DMC11 to DMC1M. When a "0" is read, however, the potential on the bit line BL01 is gradually lowered from the level $(V_D+V_S)/2$ as shown in FIG. 2J, while the potential on the bit line BL11 is held at the level $(V_D+V_S)/2$ as shown in FIG. 2K.

When the MOS transistor 10 is subsequently rendered conductive by the clock signal $\phi 1$ impressed upon its gate, the potential on the bit line BL01 is further lowered to increase the potential difference between the bit lines BL01 and BL11. When the MOS transistors 12, 6 and 8 are subsequently rendered conductive by the clock signal $\phi 2$ and $\phi 3$, the MOS transistors 2 and 4 are respectively rendered conductive and nonconductive. As a result, the potentials on the bit lines BL01 and BL11 are respectively set to the low and high levels $V_S$ and $V_D$ as shown in FIGS. 2J and 2K. Subsequently, the MOS transistors Q01 and Q11 are rendered conductive by the clock signal CL1 impressed upon their gates, whereby the data "0" is read out through the data lines DL0 and DL1.

While the operation of reading data from the memory cell MC11 has been described above as an example, it will be understood that data is similarly read out from any one of the memory cells connected to the bit lines BL01 to BL0M. When data is read out from one of the memory cells connected to the bit lines BL11 to BL1M, the same operation takes place except that the dummy word line DWL0 is energized instead of the dummy word line DWL1.

The above embodiment of the invention has been given for the purpose of illustration only and without any limitative sense, and various changes and modifications in the invention are possible. For example, while in the above embodiment, the potential on all the bit lines is set to the intermediate level $(V_D+V_S)/2$ by rendering the MOS transistors 14-1 to 14-M conductive, it is possible to precharge all bit lines by using an external precharging voltage source as shown in FIG. 3. The semiconductor memory circuit shown in FIG. 3 is the same as that shown in FIG. 1 except that here the MOS transistors 14-1 to 14-M are omitted and all the bit lines are connected through respective MOS transistors 15-1 to 15-2M to a precharging voltage supply terminal PST. Normally, the bit lines BL01 to BL0M and BL11 to BL1M are all precharged to a predetermined potential, for instance, intermediate potential $(V_D+V_S)/2$, by impression of clock signal $\phi 5$ to the gates of MOS transistors 15-1 to 15-2M and held at that potential level, and the reading operation of this semiconductor memory circuit is carried out in the same manner as described above.

Further, while in the previous embodiment the memory cells are connected to the bit lines BL01 to BL0M and BL11 to BL1M, it is possible to omit all the memory cells connected to, for instance, the bit lines BL01 to BL0M. In this case, it is possible to omit the word lines WL1 to WLP, dummy word line DWL1 and dummy memory cells DMC11 to DMC1M. Alternatively, it is convenient to form bit lines BL01 to BL0M in the same way as the bit lines BL11 to BL1M so that the degree of capacitive coupling between the bit lines BL01 to BL0M and the semiconductor substrate can be made equal to the degree of capacitive coupling between the bit lines BL11 to BL1M and the substrate.

What is claimed is:

1. A semiconductor memory circuit comprising:
   first and second voltage supply terminals;
   at least one flip-flop circuit including first and second switching means, first and second bi-stable output terminals connected through respective ones of said first and second switching means to said first voltage supply terminal, and first and second MOS transistors having drains connected to respective ones of said bi-stable output terminals and having sources connected to each other;
   paired bit lines directly connected to respective ones of said first and second bi-stable output terminals of said at least one flip-flop circuit;
   a plurality of semiconductor memory cells connected to each of said bit lines;
   a discharging circuit connected between said second voltage supply terminal and each of the sources of said first and second MOS transistors of said at least one flip-flop circuit; and
   means connected to said paired bit lines for setting and maintaining between read operations the potentials on said paired bit lines to a voltage level substantially midway between the levels of voltages of said first and second voltage supply terminals.

2. A semiconductor memory circuit according to claim 1, which further comprises dummy memory cells connected to said respective paired bit lines.

3. A semiconductor memory circuit according to claim 1 or 2, wherein said potential setting means includes a switching MOS transistor connected between said bi-stable output terminals of said at least one flip-flop circuit.

4. A semiconductor memory circuit according to claim 3, wherein after the potentials on said paired bit lines are once respectively set to the levels of voltages to be applied to said first and second voltage supply terminals, said switching MOS transistor is rendered conductive to set the potentials on said paired bit lines at a middle level between the levels of voltages to be applied to said first and second voltage supply terminals.

5. A semiconductor memory circuit according to claim 3, wherein said discharging circuit includes two MOS transistors having current paths connected in parallel with each other and having different mutual conductances.

6. A semiconductor memory circuit according to claim 4 wherein said discharging circuit includes two MOS transistors having current paths connected in parallel with each other and having different mutual conductances.

7. A semiconductor memory circuit according to claim 1 or 2 wherein said potential setting means includes a third voltage supply terminal adapted to receive a voltage at a middle level between the levels of voltages to be applied to said first and second voltage supply terminals and switching means connected between said third voltage supply terminal and said paired bit lines.

8. A semiconductor memory circuit according to claim 7, wherein said discharging circuit includes two MOS transistors having current paths connected in parallel with each other and having different mutual conductances.

9. A semiconductor memory circuit comprising:
   first and second matrix arrays of semiconductor memory cells;
   a plurality of word lines each commonly connected to semiconductor memory cells arranged in the same row of said matrix arrays;
   a plurality of first bit lines each commonly connected to semiconductor memory cells arranged in the same column of said first matrix array;
   a plurality of second bit lines each commonly connected to semiconductor memory cells arranged in the same column of said second matrix array;
   first and second voltage supply terminals;
   a plurality of flip-flop circuits each including first and second switching means, first and second bistable output terminals connected through respective ones of said first and second switching means to said first voltage supply terminal, and first and second MOS transistors having drains connected to respective ones of said first and second bi-stable output terminals and having sources connected to each other, said first bi-stable output terminal of each of said flip-flop circuits being directly connected to a different one of said first bit lines, said second bi-stable output terminal of each of said flip-flop circuits being directly connected to a different one of said second bit lines;
   a discharging circuit having one terminal connected to the sources of said first and second MOS transistors of said plurality of flip-flop circuits and another terminal connected to said second voltage supply terminal;
   and means connected to each of said first and second bit lines for setting and maintaining between read operations the potentials on said first and second bit lines to a level substantially midway between the levels of voltages of said first and second voltage supply terminals.

10. A semiconductor memory circuit according to claim 9, which further comprises a plurality of dummy cells connected to said respective first and second bit lines.

11. A semiconductor memory cells according to claim 9 or 10, wherein said potential setting means includes a plurality of switching MOS transistors each connected between said first and second bi-stable output terminals of each of said flip-flop circuits.

12. A semiconductor memory circuit according to claim 11, wherein after the potentials on said first and second plurality of bit lines are once respectively set to the levels of voltages to be applied to said first and second voltage supply terminals, each of said switching MOS transistors is rendered conductive to set the potentials on said first and second plurality of bit lines at a middle level between the levels of voltages to be applied to said first and second voltage supply terminals.

13. A semiconductor memory circuit according to claim 11, wherein said discharging circuit includes two MOS transistors having current paths connected in parallel with each other and having different mutual conductances.

14. A semiconductor memory circuit according to claim 12 wherein said discharging circuit includes two MOS transistors having current paths connected in parallel with each other and having different mutual conductances.

15. A semiconductor memory circuit according to claim 9 or 10, wherein said potential setting means includes a third voltage supply terminal adapted to receive a voltage at a middle level between the levels of voltages to be applied to said first and second voltage supply terminals and switching means connected between said third voltage supply terminal and said first and second plurality of bit lines.

16. A semiconductor memory circuit according to claim 15, wherein said discharging circuit includes two MOS transistors having current paths connected in parallel with each other and having different mutual conductances.

* * * * *